United States Patent
Zimmermann

(10) Patent No.: US 9,122,263 B2
(45) Date of Patent: Sep. 1, 2015

(54) CONTROL DEVICE FOR A MOTOR VEHICLE HAVING AN INPUT EQUIPPED FOR PROCESSING SIGNALS OF DIFFERENT TYPES OF SENSORS

(75) Inventor: Christian Zimmermann, Rottenburg (DE)

(73) Assignee: AUTOMOTIVE LIGHTING REUTLINGEN GMBH, Reutlingen (DE)

( * ) Notice: Subject to any disclaimer, the term of this patent is extended or adjusted under 35 U.S.C. 154(b) by 945 days.

(21) Appl. No.: 13/307,297

(22) Filed: Nov. 30, 2011

(65) Prior Publication Data

US 2012/0139615 A1    Jun. 7, 2012

(30) Foreign Application Priority Data

Dec. 2, 2010   (DE) .......................... 10 2010 053 304

(51) Int. Cl.
*H03K 17/60* (2006.01)
*G05B 19/042* (2006.01)

(52) U.S. Cl.
CPC ............ *G05B 19/0423* (2013.01); *H03K 17/60* (2013.01); *G05B 2219/21085* (2013.01); *G05B 2219/21114* (2013.01)

(58) Field of Classification Search
None
See application file for complete search history.

(56) References Cited

U.S. PATENT DOCUMENTS

| 4,482,822 A * | 11/1984 | Kamuro et al. ................. 326/49 |
| 5,982,290 A | 11/1999 | Berger et al. |
| 2007/0063197 A1 | 3/2007 | Burkatovsky |
| 2009/0187306 A1 | 7/2009 | Grimes et al. |

FOREIGN PATENT DOCUMENTS

| EP | 2 101 159 A2 | 6/2009 |
| WO | 2007/038168 A1 | 4/2007 |

OTHER PUBLICATIONS

Jul. 23, 2014 Communication from the European Patent Office regarding European Patent App. No. 11 18 9768.
Feb. 2008 "AN2710 Application note Safe GPIO port configuration in STR7xx devices".
Aug. 3, 2011 Examination Report for German Patent App. No. 10 2010 053 304.1.

* cited by examiner

*Primary Examiner* — Jared Fureman
*Assistant Examiner* — Terrence Willoughby
(74) *Attorney, Agent, or Firm* — Howard & Howard Attorneys PLLC

(57) ABSTRACT

A control device (42) for use in a motor vehicle includes at least one input that has an input port (12), at least one input channel (20, 38), and an input circuitry (43) and receives signals from a sensor (10, 34) via the input port (12) and sends the signals via the input circuitry (43) to the input channel (20, 38). The input port (12) is connected to a defined voltage via a resistor. The input circuitry (43) has a pull-up switch (44) that can be actuated by the control device (42), which controls connection of the input port (12) to a high voltage, and a pull-down switch (46) that can be actuated by the control device (42), which controls connection of the input port (12) to a low voltage. A method adapts the control device (42) to the sensor (10, 34), which is connected to the control device (42).

8 Claims, 5 Drawing Sheets

CONTROL DEVICE FOR A MOTOR VEHICLE HAVING AN INPUT EQUIPPED FOR PROCESSING SIGNALS OF DIFFERENT TYPES OF SENSORS

CROSS-REFERENCE TO RELATED APPLICATION

This application claims priority to and benefit of the filing date of German Patent Application 10 2010 053 304.1 entitled "Control Device for a Motor Vehicle Having an Input Equipped for Processing Signals of Different Types of Sensors" and filed on Dec. 2, 2010.

BACKGROUND OF INVENTION

1. Field of Invention

The invention relates, generally, to a control device of a motor vehicle and, more specifically, to a such a device having an input equipped for processing signals of different types of sensors and a method for adapting the control device to a sensor that is to be connected to the control device.

2. Description of Related Art

A control device of a motor vehicle having an input equipped for processing signals of different types of sensors is known per se and has at least one input with an input port, at least two input channels, and an input circuitry. It is equipped to receive signals from a sensor via the input port and to transmit the signals via the input circuitry in an input channel of the input, which is connected to a defined voltage via a resistor. A method for adapting a control device of this type to a sensor that is to be connected to the control device is also known per se.

Control devices of this type process sensor signals and generate actuating variables therefrom, with which actuating elements of the motor vehicle are actuated to affect the behavior of the motor and/or components of the motor vehicle while in operation. As a result, operating parameters, for example, of the motor vehicle should be maintained within a permissible framework. The operating parameters are mapped thereby in physical variables that are detected by sensors and converted to electric sensor signals. Interfaces are necessary to transmit the electric sensor signals to the control device, which convert the sensor signals provided by a sensor into signals that can be processed by the control device. Different sensors require different interfaces thereby. As such, for example, analog interfaces, interfaces for "PWM" signals (PWM=Pulse-Width Modulation), frequency interfaces, and bus interfaces are known.

Normally, the interfaces are integrated in the control device and have an input port, input circuitry, and an input channel. Depending on which type of sensor is to be connected to the input port, the interfaces differ with regard to their input circuitry as well as with regard to the input channel.

With regard to the input circuitry, the inputs of control devices differ, for example, in whether the defined voltage has a comparably larger value (e.g., five volts) or a comparably smaller value (e.g., zero volts). In both cases, the defined voltage serves to determine a reference voltage with which, for example, error statuses can be detected. The connection to the comparably lower voltage is then carried out when the sensor works as a current supply. The connection to the comparably higher voltage is then carried out when the sensor works as a current sink. This is normally the case with a "PWM" sensor.

With regard to the input channel, there are, for example, the following differences: To process an analog signal, an input channel with an ADC (Analog/Digital Converter) is needed, for example, and to process a "PWM" signal, an input channel with a digital port is needed instead, ideally having a "capture/compare" function.

In the currently standard case, the number of (sensor) inputs of a motor-vehicle control device corresponds precisely to the number of sensors, the signals of which are to be processed by the control device. This number can differ even within a class of motor vehicles depending on the features of the individual motor vehicles. For example, many motor vehicles are equipped with halogen lights in the headlamps as the standard option. Motor vehicles of the same type can frequently be equipped with gas-discharge bulbs on demand, however, which provide a larger light flux. To prevent the blinding of other drivers, a headlight-range adjustment is usually provided with motor vehicles having gas-discharge lamps. This is the result of legal regulations requiring a headlight-range adjustment for headlights having a light flux of more than 2,000 lumen. Normally, a headlight-range adjustment of this type uses signals from inclination sensors that are, for example, disposed in the suspension of the motor vehicle and detect the inclination of the vehicle chassis. These sensors are frequently not included in motor vehicles of the same model that are equipped with halogen bulbs.

For financial reasons, it is increasingly attempted to standardize components, including control devices. The aim of a standardization of this type is that the standardized components within a class of motor vehicles can be used as frequently as possible without differences in their features making it necessary to use different hardware with the components. This applies analogously to different classes of motor vehicles. For this, certain constraints lead to different types of sensors, regardless of the vehicle, and a different number of sensors being used for one and the same function, e.g., for the automatic headlight-range adjustment. For automatic headlight range adjustment, there are solutions known, for example, using one, two, or three sensors. Depending on the design, these sensors are equipped to send analog output signals while other sensors are equipped to provide "PWM" signals.

From the possible differences in the number and type of the sensors to be connected to a control device, there are multiple different combinations of input signals of different types. A control device that can process these different combinations must be sufficiently flexible with respect to its hardware and software.

In the framework of the example of the headlight-range adjustment, it must be possible, for example, to connect both analog sensors and "PWM" sensors. In this context, a control device is given as known having two input channels for one input. For the implementation in a specific vehicle, the control device is furnished with an input circuitry that connects one of the two input channels with the input port of this input. In this manner, control devices of one type can be adapted to different vehicles, whereby, however, for each variation, one variant of a control device is needed. The different control-device variants differ from one another in the hardware of their input circuitry.

The equipping of control devices with input circuitry that is customized for different vehicle variants is complicated, and it also makes providing replacement parts more difficult. Both drive the respective costs up, whether it is for production or providing replacement parts. The introduction of control devices to the vehicle during its production is also more complicated because different vehicle variants are frequently manufactured on the same production line and it must, therefore, be ensured that each vehicle receives the right control device.

Thus, there is a need in the related art for a control device not having the aforementioned disadvantages. There is a need in the related art also for a method of the type specified above with which it is possible to avoid the aforementioned disadvantages.

SUMMARY OF INVENTION

The invention overcomes the disadvantages in the related art in a control device for use in a motor vehicle. The control device includes at least one input that has an input port, at least one input channel, and an input circuitry and receives signals from a sensor via the input port and sends the signals via the input circuitry to the input channel. The input port is connected to a defined voltage via a resistor. The input circuitry has a pull-up switch that can be actuated by the control device, which controls connection of the input port to a high voltage, and a pull-down switch that can be actuated by the control device, which controls connection of the input port to a low voltage.

The invention overcomes the disadvantages in the related art also in a method for adapting the control device to the sensor, which is to be connected to the control device. The method includes a step of connecting the input port to a defined voltage via a resistor by a first pull-up switch that can be actuated by the control device controlling connection of the input port to a high voltage or a second pull-down switch that can be controlled by the control device controlling connection of the input port to a low voltage.

One advantage of the control device of the invention is that it requires no changes in the control-device hardware.

Another advantage of the control device of the invention is that it is a result of control commands with which the pull-up switch or pull-down switch of an input is closed.

Another advantage of the control device of the invention is that vehicle production can be carried out by an end-of-line programming of the control device.

Another advantage of the control device of the invention is that identical control devices may be used for different specification variants of the vehicle with the sensors that are to be connected thereto.

Another advantage of the control device of the invention is that logistics of the vehicle production is simplified bar that only one control-device type needs to be processed and delivered to an installation station in the production of the vehicle.

Another advantage of the control device of the invention is that it reduces the number of types of control devices that need to be kept in stock as replacement parts.

Another advantage of the control device of the invention is that it contributes to a reduction in costs.

Other objects, features, and advantages of the control device and method of the invention are readily appreciated as the same become better understood while the subsequent description of the control device and method is read taken in conjunction with the accompanying figures of a drawing thereof.

BRIEF DESCRIPTION OF EACH FIGURE OF DRAWING OF INVENTION

DETAILED DESCRIPTION OF EMBODIMENTS OF INVENTION

Figure 1:
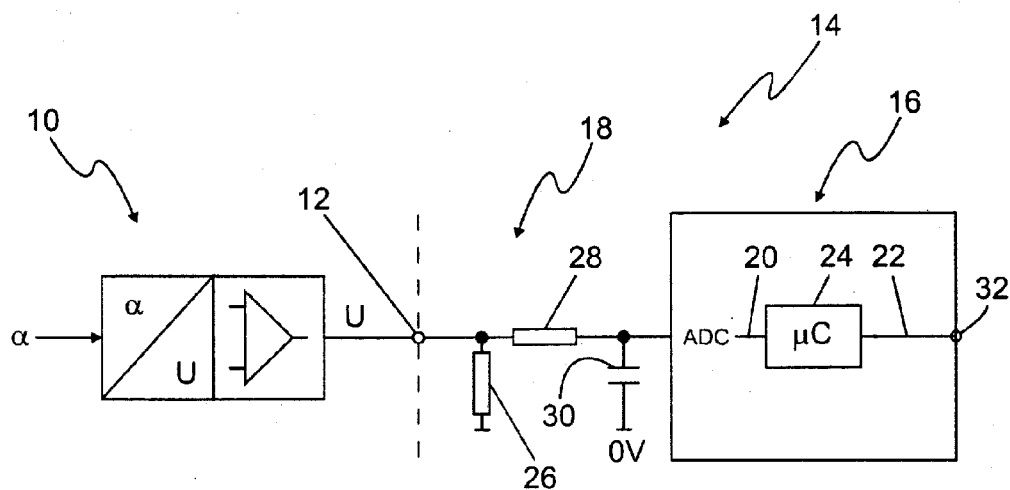
FIG. 1 is a schematic view of an analog sensor connected to a control device of the prior art.

Referring now to the figures, where like reference numerals represent like structure, FIG. 1 shows an analog sensor 10 connected at an input port 12 of a control device 14. The analog sensor 10 is equipped to determine a physical value "α" and to map it into an analog signal "U," which is provided as an output signal to the analog sensor 10. The physical value "α" is a form of an angle of inclination of a vehicle chassis or another physical value in which the inclination of the vehicle chassis is represented, e.g., a deflection of a component of the vehicle chassis.

The control device 14 has a central region 16 and a peripheral region 18. The central region 16 has an input channel 20, an output channel 22, and a microcomputer 24 having computing and storage capacities and processing signals from the input channel 20 to output signals for the output channel 22. The peripheral region 18 has an input circuitry with which the analog signal "U" provided by the analog sensor 10 is processed such that it can be sent to the input channel 20 of the central region 16 of the control device 14.

Analog sensors are typically current sources. To provide a reference voltage for a current-source sensor of this type, the input circuitry of the peripheral region 18 of the control device 14 from FIG. 1 has a pull-down resistor 26. As a result of the pull-down resistor 26, there is a lower voltage during a current-less state, i.e., when no analog sensor 10 is connected to the input port 12 in the form of ground potential at the input port 12 and, thereby, at the input channel 20 of the central region 16 as well.

The input channel 20 in this design is constructed as an analog/digital converter (ADC). The input circuitry of the peripheral region 18 has, aside from the pull-down resistor 26, a low-pass filter from a resistor 28 and a capacitor 30. This low-pass filter serves to filter the analog signals "U" and to protect against electrical surges. The microcomputer 24 processes the signals of the analog sensor 10 converted by the ADC into digital signals [and, if applicable, further signals from the sensors (not shown in FIG. 1) with recourse to stored data and programs into an actuating variable that is transmitted via the output channel 22 to an output 32 of the central region 16 and/or the control device 14]. In the case of a headlight-range adjustment, an actuating variable of this type is used for the adjustment of the headlight range of a lighting module of a front headlight of the motor vehicle, with which an undesired effect of a vehicle inclination to the headlight range is compensated for.

Figure 2:
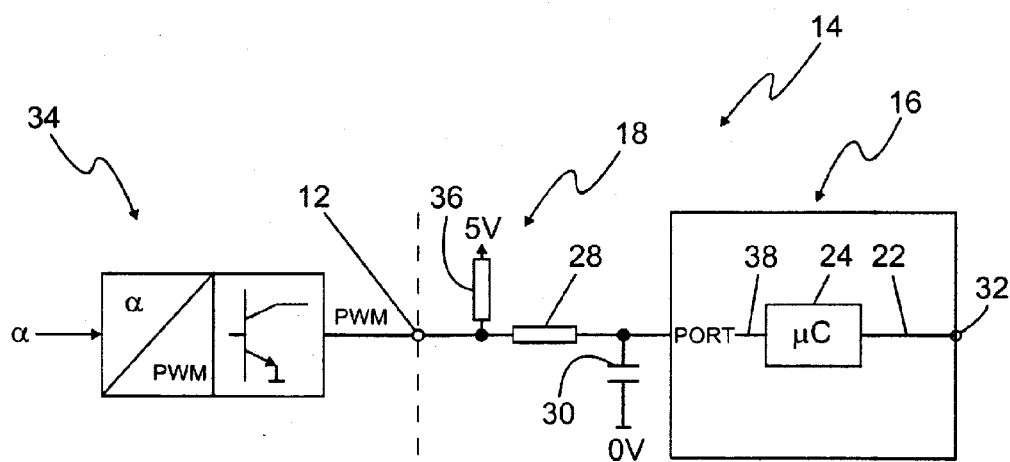
FIG. 2 is a schematic view of a "PWM" sensor connected to the control device of the prior art.

FIG. 2 shows a "PWM" sensor connected to an input port 12 of a control device 14. "PWM" sensors 34 detect a physical variable "α" and map it onto the duty cycle of a "PWM" (pulse-width modulated) signal, "PWM" sensors 34 are normally current-sinking sensors. For a current-sinking sensor 34 of this type, an input circuitry is advantageous, wherein the input port 12 is connected to a comparably higher voltage by a pull-up resistor 36. The comparably higher voltage can, for example, be a 5-volt potential if the comparably lower voltage is a ground potential of zero volts.

As with the subject matter in FIG. 1, a low-pass filter from a resistor 28 and a capacitor 30 serves to filter the input signals and protect the downstream input channel 38 from power surges in the subject matter of FIG. 2 as well.

The input channel 38 in the subject matter of FIG. 2 is designed as a digital "capture/compare" function. A comparison of FIG. 1 and FIG. 2 shows that the topologies of the input circuitries in the peripheral regions 18 as well as with respect to the configuration of the components and necessary resources in the central region 16 of the control device 14 are different. While one needs an "ADC" input channel 20 to process an analog sensor 10, for the processing of a "PWM" sensor 34, a digital port must be provided (ideally, with a "capture/compare" function).

Both FIGS. 1 and 2 show, respectively, only one sensor connected to the control device 14 and, thereby, also only one input. Normally, there are additional sensor inputs available in processing-control devices 14, wherein the number of inputs is greater than or equal to the number of sensors to be connected to the control device 14.

Figure 3:
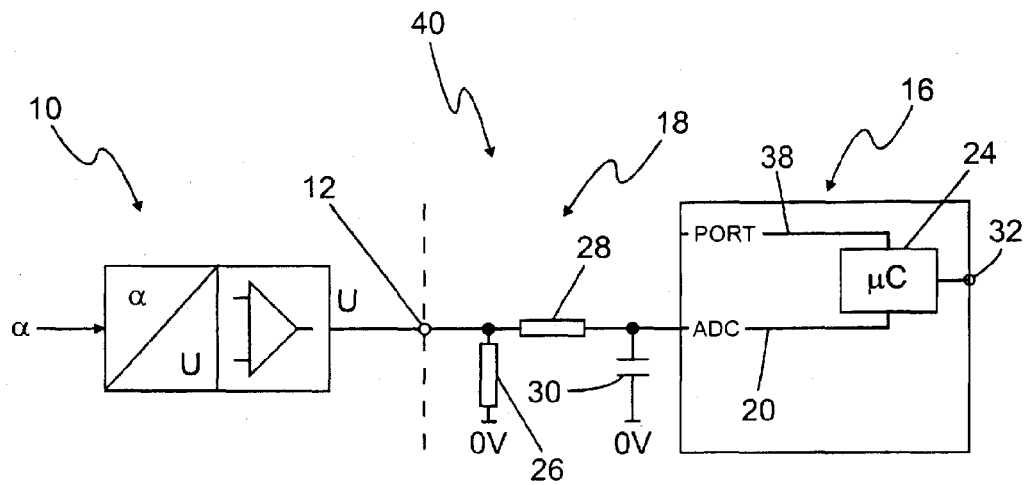
FIG. 3 is a schematic view of an analog sensor connected to a control device of the prior art.

FIG. 3 shows, in a manner similar to that of FIG. 1, an analog sensor 10, to which a likewise known control device 40 is connected at an input port 12. The control device 40 differs from the control device 14 in FIG. 1 in that it is equipped for an input port 12, an analog input channel 20, and a digital input channel 38. The control device 40 in FIG. 3 offers, therefore, greater flexibility than the control device 14 in FIG. 1 because it allows for a connection of an analog sensor 10 as well as a connection of a "PWM" sensor 34 at the same input port 12. For the connection of an analog sensor 10 to the input port 12, the input port 12 is connected inside the control device 40 to the "ADC" input channel 20 of the central region 16 of the control device 40 by an input circuitry, as has already been explained in reference to FIG. 1. The input port 12 within the control device 40 having the pull-down resistor 26 is connected to a low voltage, e.g., the ground potential at zero volts. The input circuitry connects the input port 12 within the control device 40 to the "ADC" input channel 20 and has, aside from the pull-down resistor 26, the low-pass filter from the resistor 20 and a capacitor 30, previously explained in reference to FIG. 1.

Figure 4:
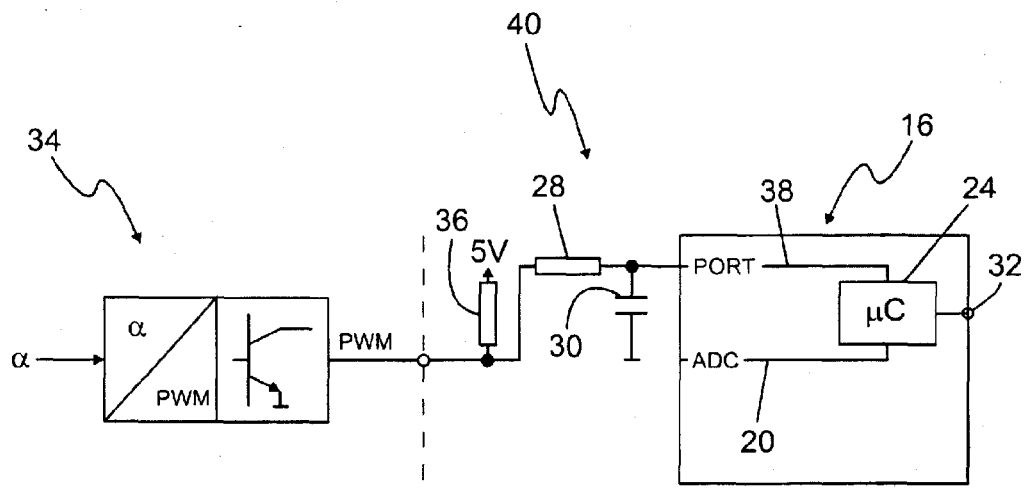
FIG. 4 is a schematic view of a "PWM" sensor connected to the control device of the prior art.

FIG. 4 shows the control device 40 in FIG. 3 with the alternative input circuitry, which has already been explained in reference to FIG. 2. The input circuitry 12 is connected to a comparably higher voltage via a pull-up resistor 36, e.g., having a potential of five volts. This input circuitry serves, as has already been explained in reference to FIG. 2, to connect a "PWM" sensor 34 to the input port 12. For this, the input port 12 is connected to the digital input channel (port) 38 of the central region 16 of the control device 40 via the input circuitry, which, in the embodiment shown, aside from the pull-up resistor 28, has another low-pass filter from the resistor 28 and capacitor 30.

Figure 5:
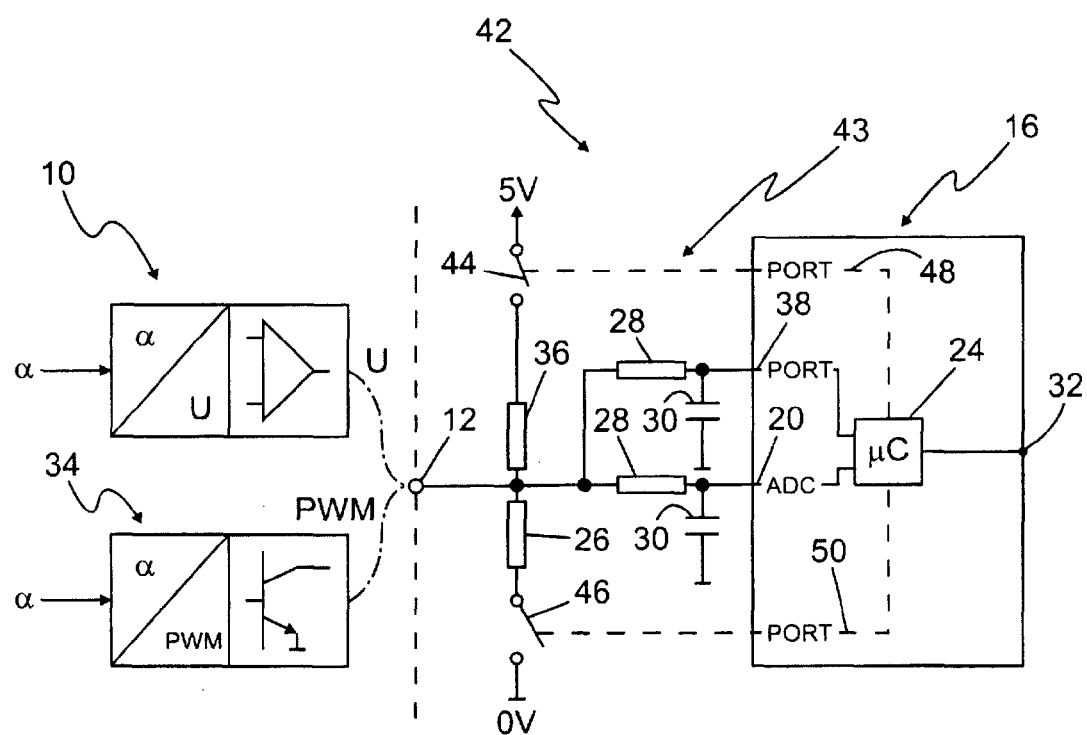
FIG. 5 is a schematic view of a control device according to a first embodiment of the invention.

FIG. 5 shows a first embodiment of a control device 42 according to the invention. The input circuitry 43, connecting the input port 12 with the central region 16, has a first pull-up switch 44 that can be actuated by a control device 42, which controls a connection of the input port 12 to a high voltage. An input circuitry 43 of a second switch 46 can be controlled by the control device 42, which controls a connection of the input port to a low voltage and can, therefore, be described as a pull-down switch 46.

The high voltage can, in this embodiment and in the following embodiment shown in FIG. 6, conduct five volts without being pre-assigned to such a value. The low voltage can be zero volts without the need to be pre-assigned to such a value.

In an embodiment, the pull-up switch 44 is controlled through a separate digital port 48 by a microcomputer 24. The pull-down switch 46 is controlled in an embodiment via a separate digital port 50 by a microcomputer 24. When one of the two switches 44, 46 is closed, the other switch 44, 46 is opened. In this manner, the control of the two switches 44, 46 is executed in a manner complimentary to one another. The complimentary aspect of the actuation makes it possible to control both switches 44, 46 via one and the same port if the switches 44, 46 are designed as complimentary switches with "CMOS" logic. One of the two switches 44, 46 would then be designed as an "NMOS" transistor, and the other of the two switches 44, 46 would then be designed as a "PMOS" transistor.

In another embodiment, the two switches 44, 46 are designed as complementary bi-polar transistors, i.e., one as a "pnp" transistor and one as an "npn" transistor. In an embodiment, the pull-up switch 44 lies in a series with the pull-up resistor 36, and the pull-down switch lies in a series with the pull-down resistor 26. Furthermore, the input circuitry 43 connects both the analog input channel 20 as well as the digital input channel 38 of the central region 16 of the control device 42 with the input port 12.

Figure 6:
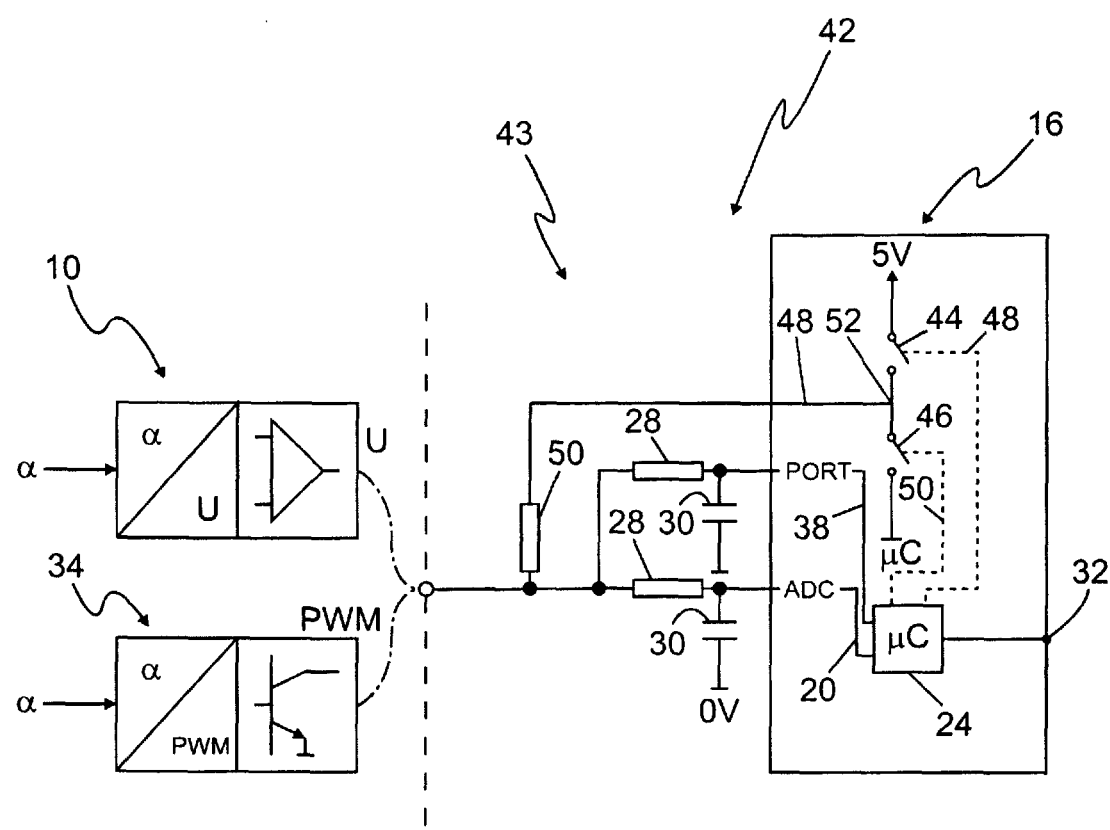
FIG. 6 is a schematic view of a control device according to a second embodiment of the invention.

In the embodiments shown in FIGS. 5 and 6, this results in each case via a low-pass filter from a resistor 28 and a capacitor 30. The low-pass filter serves here as well to filter the input signals and protect the input channels 20, 38 from voltage surges. The low-pass filter represents, thereby, in each case merely a design of a filter network with which an input channel 20, 38 is connected to the input port 12. Both the analog input channel 20 as well as the digital input channel 38 have a separate low-pass filter or a separate filter network, respectively.

That the resistors 28 and the capacitors 30 of the two input channels 20, 38 of the central region 16 of the control device 42 have the same reference numbers indicates that, in an embodiment, they each have the same impedance. In another embodiment, the components of the filter network of the digital input channel 38 may also have a different impedance value than that of the components of the filter network of the analog channel 20.

The input signal at the input port 12 is, independently of whether or not is generated by an analog sensor 10 or a "PWM" sensor 34, applied to both the analog input channel 20 having an "ADC" converter as well as to the digital input channel 38. If it is the case that an analog sensor 10 is connected to the input port 12, the pull-up switch 44 is opened, and the pull-down switch 46 is closed for the input impedance of the input circuitry 43 to be adjusted for the signals of the analog sensor 10. If, however, a "PWM" sensor 34 is connected to the input port 12, the pull-up switch 44 is closed and, simultaneously, the pull-down switch 46 is opened such that the input impedance of the input circuitry 43 is adjusted for the signals of the "PWM" sensors 34.

The signal of the sensor connected to the input port 12 is, therefore, applied to the analog input channel 20 as well as the digital input channel 38. Of these signals, applied to both input channels 20, 38, the roc 24 subsequently processes either the signal of solely the input channel 20 or the input channel 38. Which signal is processed depends on whether the pull-up switch 44 or the pull-down switch 46 is closed. If the pull-down switch 46 is closed, the microcomputer 24 selects stored software structures adapted to the processing of signals from analog sensors 10. Alternatively, the microcomputer 24 selects stored software structures adapted to a processing of the signals from "PWM" sensors 34 when the pull-up switch 44 is closed.

In the embodiment shown in FIG. 5, both the pull-up switch 44 and the pull-down switch 46 are a component of the input circuitry 42.

FIG. 6 shows another embodiment in which a high-side switch and low-side switch already existing in a digital port are used as a pull-up switch 44 and a pull-down switch 46. The input circuitry 43 no longer needs separate pull-up switches and pull-down switches, reducing the number of components needed and, thereby, the spatial requirements of the input circuitry and the costs required for the realization of the input circuitry. The embodiment from FIG. 6 allows for the two resistors 26, 36 of the embodiment in FIG. 5 to be replaced by a single resistor 51 lying between the input port 12 and a center tap 52 and connected between the two switches 44, 46 lying in a series.

Figure 7:
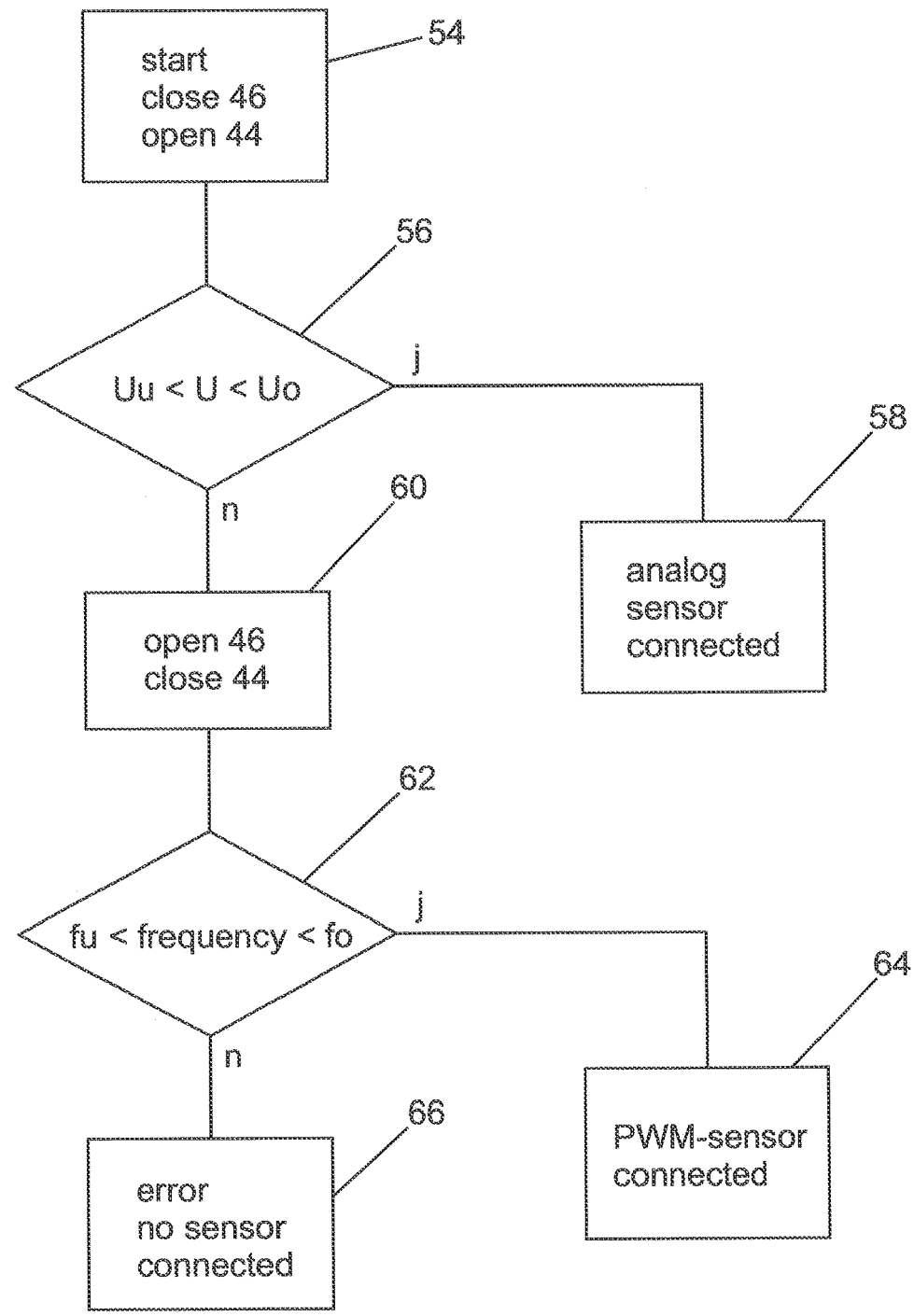
FIG. 7 is a schematic view of a method according to an embodiment of the invention.

The embodiments shown in FIGS. 6 and 7 illustrate embodiments, respectively, with the switching topologies lying between the input port. 12 and the microcomputer 24. A universal sensor input of a control device 42 can be configured via switching signals, which can, in principle, analyze with a single input circuitry 43 both an analog signal as well as a "PWM" signal and is first configured at the moment the control device 42 is installed in a motor vehicle or at a later point in time appropriate to the respective type of sensor connected to it. In this case, a configuration is understood to mean an adjustment of the input impedance of the universal sensor input and a selection and activation of the software structures required for the analysis of the sensor signals and that is adapted to the respective type of sensor.

The configuration can, for example, be obtained by a "line end" programming or by an auto-detection of the type of sensor that is connected (executed by the control device 42 itself) in the framework of the "zero point" programming necessary for the later operation of the connected sensor. The "zero point" programming is understood to mean that the control device 42 detects the sensor signal at a defined state of the motor vehicle and stores it as a reference value or as a "zero point."

In an embodiment of the method of the invention, a step sequence takes place prior to this "zero point" programming in which the applied sensor signal is analyzed and the type of sensor installed in the respective type of vehicle or the number and types of installed sensors, respectively, is determined to use this data henceforth for the analysis of the connected sensors.

FIG. 7 shows a flow chart as an embodiment of such a method. In step 54, the step sequence is started, wherein the start—in particular, at the line end (i.e., after the installation of the control device and the connection of the sensors)—takes place at the input port 12 of the control device 42. In one embodiment, in step 54, together with the start, the pull-down switch 46 is closed, and the pull-up switch 44 is opened. In this manner, the input impedance of the input circuitry 43 of a control device 42, as is explained in connection with FIGS. 5 and 6, is adjusted for an analog sensor 10.

In step 56, the microcomputer checks whether a constant "DC" voltage is applied to its input port 12 and having a value in an acceptable range "Uu<U<Uo." The lower limit "Uu" of the acceptable range lies, for example, at two volts and the upper limit "Uo" of the acceptable range lies, for example, at three volts. If a plausible "DC" voltage is obtained in step 56, this means that a "DC" voltage has been detected lying in the acceptable range. Then, the query in step 56 receives a positive response, and the program advances to step 58.

In step 58, it is recorded that an analog sensor 10 is connected to the input port 12. Furthermore, in step 58, the software structures adapted for it are selected for the later analysis of the sensor signals of the analog sensor 10. To enable such a selection process, all software structures are stored in the control device, which are adapted to the evaluation of the voltage of the sensors that are to be connected at the input port 12.

Should, however, the query in step 56 receive a negative response, this may mean that either there is no sensor connected to the input port 12 or a "PWM" sensor 34 is connected to the input port 12. To differentiate between these two cases, in the subsequent step 60, the pull-down current path is deactivated through the opening of the pull-down switch 46, and the pull-up current path is deactivated through the closing of the pull-up switch 44. As a result, the input impedance of the input circuitry is adjusted for a "PWM" sensor.

The step sequences 60, 62, 64 can also be carried out prior to the step sequences 54, 56, 58. Whether or not it is first checked if a "PMW" sensor is connected or if an analog sensor is connected is of no significance.

Subsequently, in step 62, it is checked whether a signal with a plausible frequency for a "PWM" sensor 34 is applied at the input port 12. In an embodiment, this is carried-out in that the one frequency of the signal applied at the input port 12 is compared with a lower frequency threshold "fu" and an upper frequency threshold "fo" If the determined frequency lies within the interval bordered by the frequency thresholds "fu" and "fo," then the query in step 62 receives a positive response and the program advances to step 64.

In step 64, the information that a "PWM" sensor 34 is connected to the input port 12 is saved, and software structures—adapted for an analysis of the signal of a "PWM" sensor 34 of this type for the later operation of the combination of this type of sensor and the control device 42—are selected.

If, however, the query in step 62 receives a negative response, the program advances to step 66 in which an "error" message is saved and/or a user is notified. The "error" message to be saved or displayed states therein that no functional sensor 10, 34 is connected to the input port 12.

In the normal case, wherein the control device 42 has numerous inputs that can be configured, the auto-detection procedure—an embodiment for which is explained in reference to FIG. 7—is carried out for each of the sensor inputs that can be configured. If neither an analog sensor 10 nor a "PWM" sensor 34 is detected at an input, the input will be deactivated and not taken into account in signal analyses during subsequent operation of the control device.

This constellation can occur, for example, when the individual vehicle requires only two sensors for a certain function such as the headlight-range adjustment, but the control device for this function offers three inputs to accommodate other vehicle variations. In an embodiment, the configuration detected—in this case, the configuration with two sensors—is indicated to an operator. In this manner, errors in the sensors and/or the number of connected sensors can be detected at the line end. The control device 14 controls sequence of the method.

The control device 14 and method been described in an illustrative manner. It is to be understood that the terminology that has been used is intended to be in the nature of words of description rather than of limitation. Many modifications and variations of the control device 14 and method are possible in light of the above teachings. Therefore, within the scope of the appended claims, the control device 14 and method may be practiced other than as specifically described above.

What is claimed is:

1. A control device (42) for use in a motor vehicle, said control device (42) comprising:
at least one input that includes an input port (12), at least one input channel (20, 38), and an input circuitry (43) and receives signals from a sensor (10, 34) via said input port (12) and sends said signals via said input circuitry (43) to said input channel (20, 38), wherein said input port (12) is connected to a defined voltage via a resistor and said input circuitry (43) has a pull-up resistor (36), a pull-down resistor (26), a pull-up switch (44) connected in series with said pull-up resistor (36) and that can be actuated by said control device (42), which controls connection of said input port (12) to a high voltage, and a pull-down switch (46) connected in series with said pull-down resistor (26) and that can be actuated by said control device (42), which controls connection of said input port (12) to a low voltage.

2. A control device (42) as set forth in claim 1, wherein said control device (42) controls said pull-up switch (44) via a separate digital port (48) controlled by a microcomputer (24) and said pull-down switch (46) via a separate digital port (50) controlled by said microcomputer (24).

3. A control device (42) as set forth in claim 2, wherein when one of said pull-up and pull-down switches (44, 46) is closed, other of said pull-up and pull-down switches (44, 46) is opened.

4. A control device (42) as set forth in claim 1, wherein said pull-up and pull-down switches (44, 46) are either of complimentary field-effect transistors and complimentary bi-polar transistors and said control device (42) controls said pull-up and pull-down switches (44, 46) via said input port (12).

5. A control device (42) as set forth in claim 1, wherein said input circuitry (43) connects both an analog input channel (20) and digital input channel (38) of a central region (16) of said control device (42) with said input port (12).

6. A control device (42) as set forth in claim 1, wherein said pull-up and pull-down switches (44, 46) are implemented via a digital port with an existing high-side switch and low-side switch.

7. A method for adapting a control device (42) to a sensor (10, 34) that is to be connected to the control device (42), wherein the control device (42) is for use in a motor vehicle and includes at least one input that has an input port (12), at least one input channel (20, 38), and an input circuitry (43) and receives signals from the sensor (10, 34) via the input port (12) and sends the signals via the input circuitry (43) to the input channel (20, 38), wherein said method comprises a step of:
connecting the input port (12) to a defined voltage via a resistor either by a first pull-up switch (44) that can be actuated by the control device (42) controlling connection of the input port (12) to a high voltage and a second pull-down switch (46) that can be controlled by the control device (42) controlling connection of the input port (12) to a low voltage;
closing the pull-down switch (46);
opening the pull-up switch (44);
checking whether a constant DC voltage "U" is at an input channel (20) and a value of the voltage "U" lies in an acceptable range of Uu<U<Uo;
saving that an analog sensor (10) is connected to the input port (12) when the voltage "U" is at the input channel (20) and the value of the voltage "U" lies in the acceptable range of Uu<U<Uo; and
selecting software structures for analysis of signals of the analog sensor (10).

8. A method for adapting a control device (42) to a sensor (10, 34) that is to be connected to the control device (42), wherein the control device (42) is fix use in a motor vehicle and includes at leas input that has an input port (12), at leas one input channel (20, 38), and an input circuitry (43) and receives signals from the sensor (10, 34) via the input port (12) and sends the signals via the input circuitry (43) to the input channel (20, 38), wherein said method comprises a step of:
connecting the input port (12) to a defined voltage via a resistor either by a first pull-up switch (44) that can be actuated by the control device (42) controlling connection of the input port (12) to a high voltage and a second pull-down switch (46) that can be controlled by the control device (42) controlling connection of the input port (12) to a low voltage;
closing the pull-down switch (46);
opening the pull-up switch (44);
checking whether a constant DC voltage "U" is at an input channel (20) and a value of the voltage "U" lies in an acceptable range of Uu<U<Uo;
saving that an analog sensor (10) is connected to the input port (12) when the voltage "U" is at the input channel (20) and the value of the voltage "U" lies in the acceptable range of Uu<U<Uo;
selecting software structures for analysis of signals of the analog sensor (10);
deactivating a pull-down current path through an opening of the pull-down switch (46);
activating a pull-up current pad through a closing of the pull-up switch (44);
checking whether a signal with a plausible frequency for a PWM sensor is applied to the input port (12);
saving information that the PWM sensor (34) is connected to the input port (12) if the PWM sensor (34) is connected to the input port (12); and
selecting software structures for analysis of signals of the PWM sensor (34).

* * * * *